United States Patent
Lee et al.

(10) Patent No.: US 9,859,271 B2
(45) Date of Patent: Jan. 2, 2018

(54) ELECTROSTATIC DISCHARGE PROTECTION CIRCUIT, ESD PROTECTION SEMICONDUCTOR DEVICE, AND LAYOUT STRUCTURE OF ESD PROTECTION SEMICONDUCTOR DEVICE

(71) Applicant: UNITED MICROELECTRONICS CORP., Hsin-Chu (TW)

(72) Inventors: Ching-Wei Lee, Taoyuan (TW); Li-Cih Wang, Taoyuan (TW); Tien-Hao Tang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/007,163

(22) Filed: Jan. 26, 2016

(65) Prior Publication Data

US 2017/0194314 A1 Jul. 6, 2017

(30) Foreign Application Priority Data

Jan. 5, 2016 (TW) .............................. 105100110 A (51) Int. Cl.
*H01L 27/02* (2006.01)
*H01L 29/74* (2006.01)
*H01L 29/06* (2006.01)

(52) U.S. Cl.
CPC ...... *H01L 27/0262* (2013.01); *H01L 29/0619* (2013.01); *H01L 29/7436* (2013.01)

(58) Field of Classification Search
CPC ............. H01L 27/0262; H01L 29/0619; H01L 29/7436
See application file for complete search history.

(56) References Cited

U.S. PATENT DOCUMENTS

| 8,324,658 B2 | 12/2012 | Tsai et al. | |
|---|---|---|---|
| 8,405,943 B2 | 3/2013 | Song et al. | |
| 2010/0019318 A1* | 1/2010 | Chao | H01L 29/7833 257/336 |
| 2015/0371985 A1* | 12/2015 | Edwards | H01L 27/0262 257/124 |

OTHER PUBLICATIONS

Wang, Title of Invention: Electrostatic Discharge Protection Circuit and Electrostatic Discharge Protection Device, U.S. Appl. No. 14/594,173, filed Jan. 12, 2015.

* cited by examiner

*Primary Examiner* — Laura Menz
*Assistant Examiner* — Candace Y Chan
(74) *Attorney, Agent, or Firm* — Winston Hsu (57) ABSTRACT

An ESD protection semiconductor device includes a substrate, a buried layer buried in the substrate, a first well formed in the substrate, a first doped region formed in the first well, a second doped region formed in the first well and adjacent to the first doped region, a second well formed in the first well, and a third doped region formed in the second well. The buried layer, the first well, the first doped region, and the third doped region include a first conductivity type while the second doped region and the second well include a second conductivity type complementary to the first conductivity type. The second well is spaced apart from the first doped region and the second doped region by the first well.

13 Claims, 6 Drawing Sheets

ELECTROSTATIC DISCHARGE PROTECTION CIRCUIT, ESD PROTECTION SEMICONDUCTOR DEVICE, AND LAYOUT STRUCTURE OF ESD PROTECTION SEMICONDUCTOR DEVICE

BACKGROUND OF THE INVENTION

1. Field of the Invention

The present invention relates to an electrostatic discharge (hereinafter abbreviated as ESD) protection circuit, an ESD protection device, and a layout structure of an ESD protection semiconductor device, and more particularly, to an ESD protection circuit including ESD protection semiconductor device and layout structure of the ESD protection semiconductor device.

2. Description of the Prior Art

With the advancement of technology, the development of semiconductor process is ongoing. A modern chip is therefore allowed to have a plurality of various electronic circuits configured within. For example, the integrated circuits (hereinafter abbreviated as ICs) integrated in the chip(s) can be divided into core circuits and input/output (hereinafter abbreviated as I/O) circuits, and the core circuits and the I/O circuits are respectively driven by different power supply sources with different voltages. And for receiving the externally provided power, pads for the core circuits and I/O circuits are required.

However, it is found that electrostatic charges are easily transferred to the inner circuits in the chip by those pads during processes such as manufacturing, testing, packaging, and delivering, etc. The electrostatic charges impact and damage the inner circuits in the chip(s), and this unwanted condition is named electrostatic discharge (ESD). As products based on ICs become more delicate, they also become more vulnerable to the impacts from external environment. And thus, it is assumed that ESD is a constant threat to the modern electronics. As a countermeasure against to the ESD issue, there have been proposed ESD protection circuits/devices. Typically, during a normal IC operation, the ESD protection device is turned off. However when an ESD event occurs, the ESD protection device must be quickly triggered, so that the ESD current is immediately bypassed from the inner circuit.

Typically, when a voltage across the ESD protection device/circuit is higher than trigger voltage (Vt1), snapback breakdown occurs and the voltage is clamped. In other words, when snapback breakdown occurs, the voltage across the circuit drops down to the holding voltage. It is found the low holding voltage leads better robustness. However, a problem arises when the holding voltage is lower than the operating voltage (Vdd) at which the ESD protection device/circuit operates: it is easily latched-up and thus cannot provide protection to the internal circuit. In order to solve the latch-up issue, a stacked ESD device has been introduced. Despite having a relatively high holding voltage, the stacked ESD device is formed by a plurality of gate-grounded n-type metal-oxide-semiconductor (nMOS) transistors electrically connected in series, thereby requiring larger layout area.

SUMMARY OF THE INVENTION

According to the claimed invention, an ESD protection circuit is provided. The ESD protection circuit includes a first voltage line providing a first supply voltage, a second voltage line providing a second supply voltage, a first silicon controlled rectifier (hereinafter abbreviated as SCR), and a second SCR. An anode of the first SCR is electrically connected to the first voltage line and a cathode of the first SCR is electrically connected to the second voltage line. An anode of the second SCR is electrically connected to the first voltage line and a cathode of the second SCR is electrically connected to the second voltage line.

According to the claimed invention, an ESD protection semiconductor device is provided. The ESD protection semiconductor device includes a substrate, a buried layer buried in the substrate, a first well formed in the substrate, a first doped region formed in the first well, a second doped region formed in the first well and adjacent to the first doped region, a second well formed in the first well, and a third doped region formed in the second well. The buried layer, the first well, the first doped region, and the third doped region include a first conductivity type while the second doped region and the second well include a second conductivity type. And the first conductivity type and the second conductivity type are complementary to each other. Furthermore, the second well is spaced apart from the first doped region and the second doped region by the first well.

According to the claimed invention, a layout structure of an ESD protection semiconductor device is provided. The layout structure of the ESD protection semiconductor device includes a first well, a ring-shaped first doped region formed in the first well, at least a second doped region formed in the ring-shaped first doped region, a second well formed in the first well, a third doped region formed in the second well, and a ring-shaped fourth doped region formed in the second well. The first well, the ring-shaped first doped region, and the third doped region include a first conductivity type while the second doped region, the second well, and the ring-shaped fourth doped region include a second conductivity type. And the first conductivity type and the second conductivity type are complementary to each other. Furthermore, the ring-shaped fourth doped region surrounds the third doped region.

According to the ESD protection semiconductor device and the layout structure of the ESD protection semiconductor device provided by the present invention, the second doped region formed in the ring-shaped first doped region and complementary to the ring-shaped first doped region is provided. Thus a dual SCR is obtained by the second doped region and other well/doped region. The anodes of the dual SCR are all electrically connected to the first voltage line while the cathodes of the dual SCR are all electrically connected to the second voltage line. Consequently, an ESD protection circuit is obtained. According to the ESD protection circuit, the ESD protection semiconductor device and the layout structure of the ESD protection semiconductor device provided by the present invention, lower $R_{ON}$ and superior robustness are obtained without increasing layout area due to the introduction of the dual SCR.

These and other objectives of the present invention will no doubt become obvious to those of ordinary skill in the art after reading the following detailed description of the preferred embodiment that is illustrated in the various figures and drawings.

DETAILED DESCRIPTION

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have been described in detail in order to avoid obscuring the invention.

It will be understood that when an element is referred to as being "formed" on another element, it can be directly or indirectly, formed on the given element by growth, deposition, etch, attach, connect, or couple. And it will be understood that when an elements or a layer is referred to as being "on", "connected to", or "coupled to" another element or layer, it can be directly on, connected or coupled to the other element or layer or intervening elements or layers may be present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer and/or section from another. Thus, a first element, component, region, layer or section discussed below could be termed a second element, component, region, layer or section without departing from the teachings of the disclosure.

Spatially relative terms, such as "beneath", "below", "lower", "above", "upper", "in", "on" and the like, may be used herein for ease of description to describe one element or feature's relationship to another element(s) or feature(s) as illustrated in the figures. It will be understood that spatially relative terms are intended to encompass different orientations of the device in use or operation in addition to the orientations depicted in the figures. For example, if the device in the figures in turned over, elements described as "below" or "beneath" can encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to be limiting of the inventions. As used herein, the singular form "a", "an" and "the" are intended to include the plural forms as well, unless the context clearly indicates otherwise.

Figure 1:
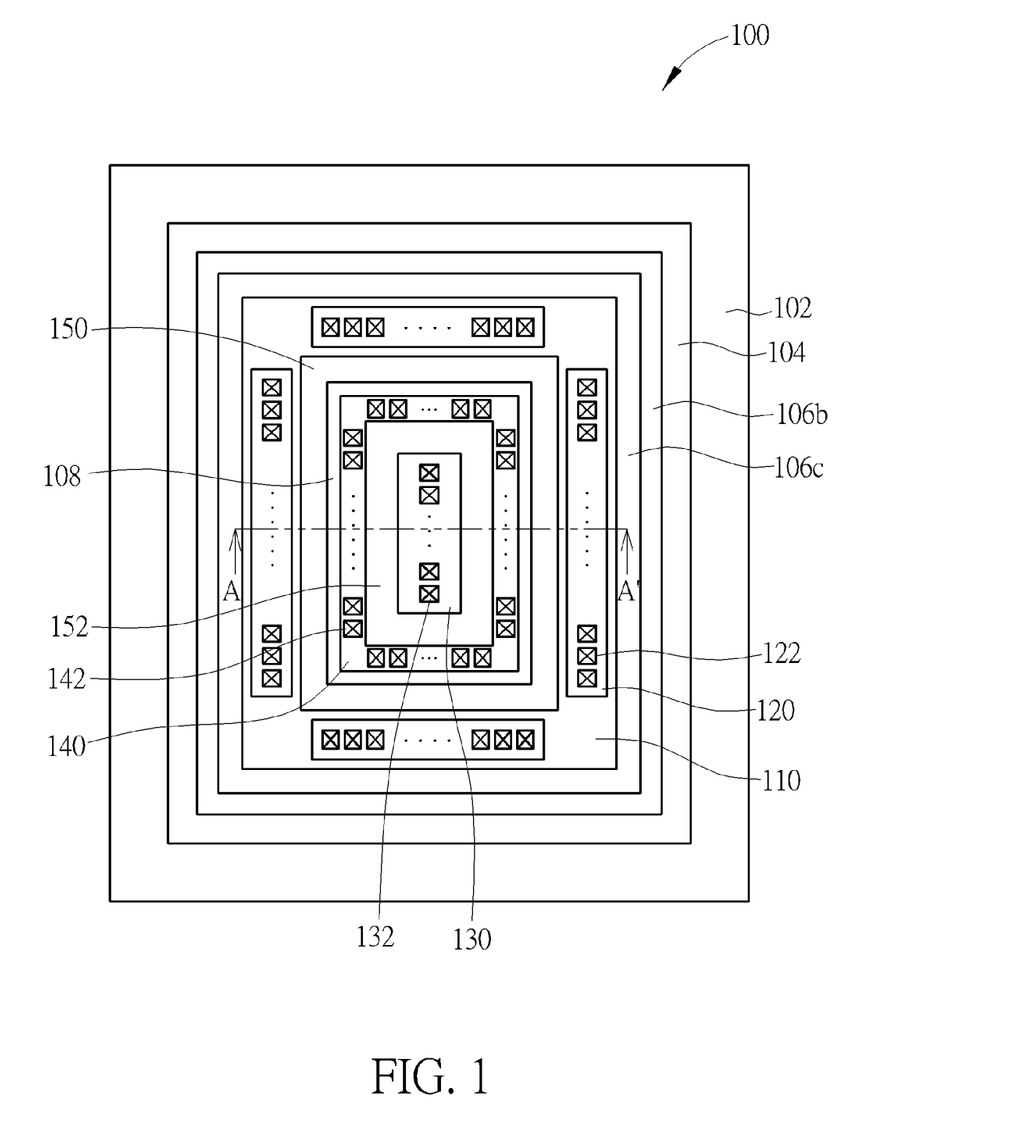
FIG. 1 is a schematic drawing illustrating a layout structure of an ESD protection semiconductor device provided by a preferred embodiment of the present invention.
Figure 2:
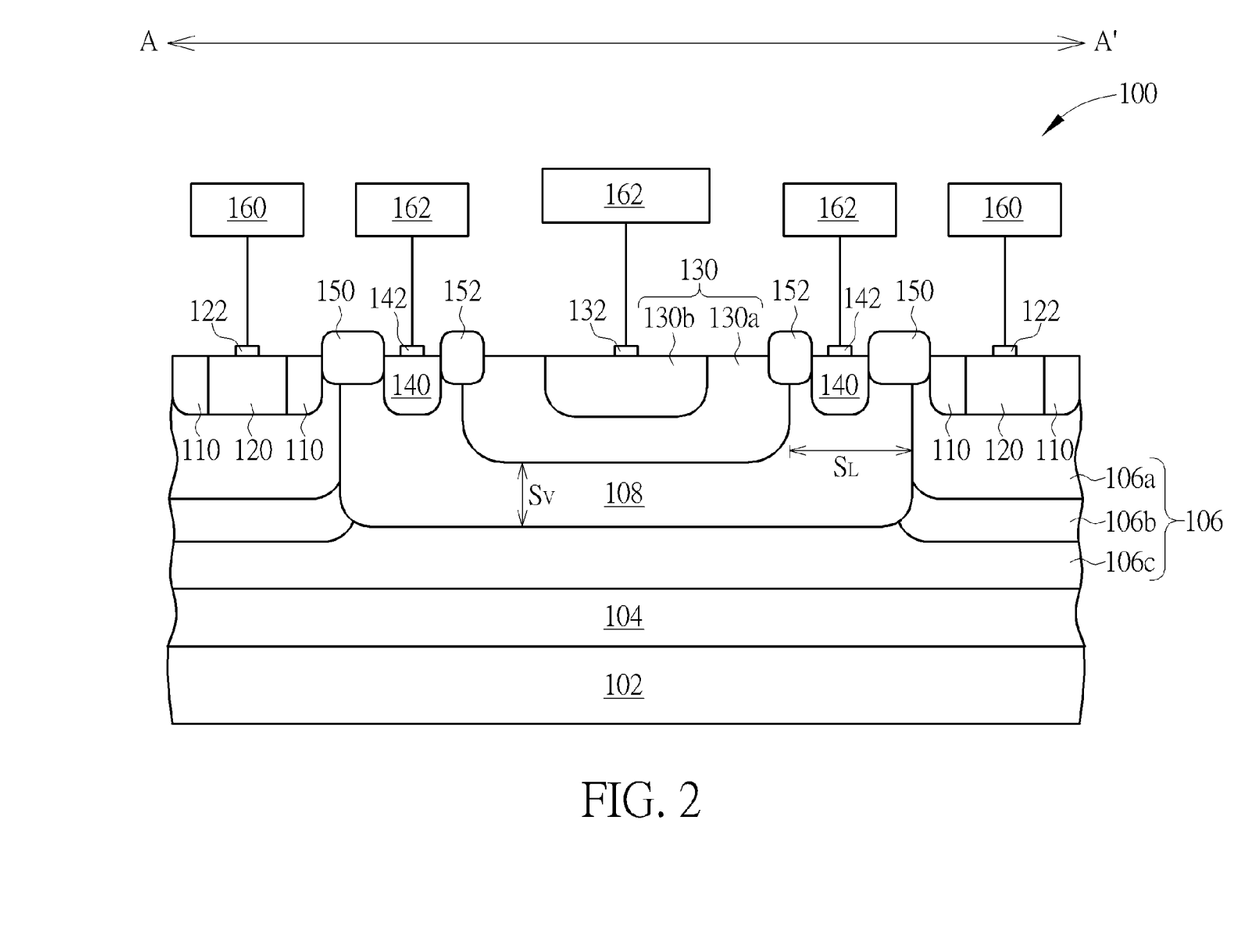
FIG. 2 is a schematic drawing illustrating the ESD protection semiconductor device provided by the preferred embodiment, and a cross-sectional view taken along a line A-A' of FIG. 1.

Please refer to FIGS. 1 and 2, wherein FIG. 1 is a schematic drawing illustrating a layout structure of an ESD protection semiconductor device provided by a preferred embodiment of the present invention, and FIG. 2 is a schematic drawing illustrating the ESD protection semiconductor device provided by the preferred embodiment. Particularly, FIG. 2 is a cross-sectional view taken along a line A-A' of FIG. 1. As shown in FIGS. 1 and 2, the preferred embodiment provides an ESD protection semiconductor device 100 and a layout structure of the ESD protection semiconductor device 100. The ESD protection semiconductor device 100 and its layout structure 100 include a substrate 102, and a buried layer 104 is buried in the substrate 102. The buried layer 104 includes a first conductivity type. According to the preferred embodiment, the first conductivity type is an n type. A first well 106 is formed in the substrate 102, and the first well 106 includes the first conductivity type. That is, the first well 106 is an n-well. It is noteworthy that in some embodiments of the present invention, the first well 106 can include a plurality of sub-wells. As shown in FIGS. 1 and 2, the first well 106 downwardly and sequentially includes an n-well 106a, a high voltage well 106b for tolerating high voltage, and a deep well 106c. As shown in FIG. 2, the first well 106 is formed on the buried layer 104, and thus a bottom of the first well 106, that is a bottom of the deep well 106c, contacts the buried layer 104. In the preferred embodiment, a concentration of the buried layer 104 is larger than a concentration of the first well 106, but not limited to this.

Figure 3:
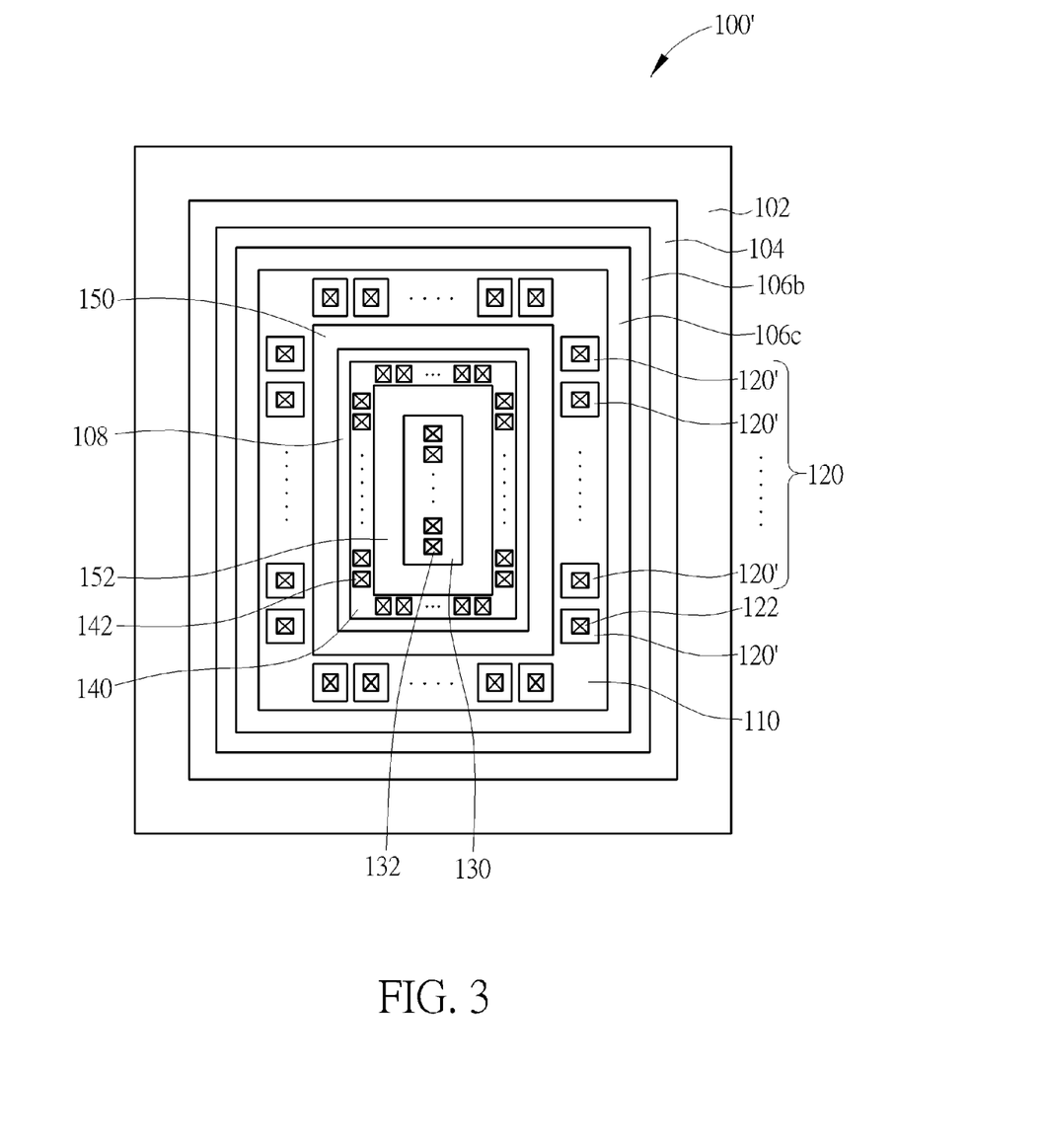
FIG. 3 is a schematic drawing illustrating a layout structure of an ESD protection semiconductor device provided by a modification to the present invention.
Figure 4:
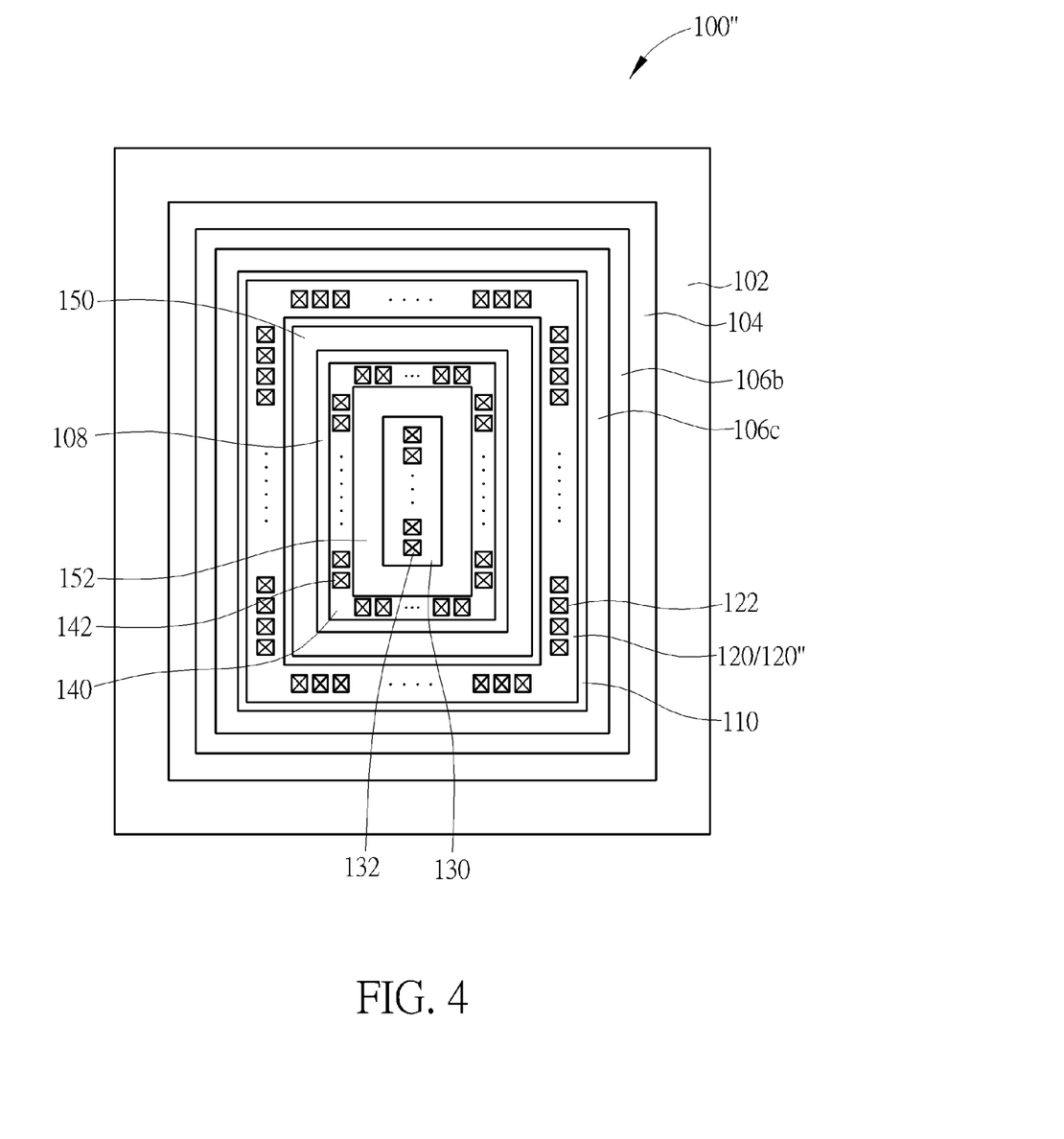
FIG. 4 is a schematic drawing illustrating a layout structure of an ESD protection semiconductor device provided by another modification to the present invention.

Please still refer to FIGS. 1 and 2. A ring-shaped first doped region 110 is formed in the first well 106, particularly formed in the n-well 106a of the first well 106. And the ring-shaped first doped region 110 includes the first conductivity type. It is noteworthy that a concentration of the ring-shaped first doped region 110 is larger than the concentration of the first well 106. More important, at least a second doped region 120 is formed in the first well 106 and in the ring-shaped first doped region 110. The second doped region 120 is adjacent to the first doped region. In other words, at least two opposite sides of the second doped region 120 contact the ring-shaped first doped region 110. Furthermore, in some preferred embodiments of the present invention, a depth of the second doped region 120 is equal to a depth of the first doped region 110, but not limited to this. The second doped region 120 includes a second conductivity type. The first conductivity type and the second conductivity type are complementary to each other. Accordingly, the second conductivity type is a p type in the preferred embodiment. However, it is well-known to those skilled in the art that the first conductivity type can be a p type and the second conductivity type can be an n type. At least a contact plug 122 is disposed in the second doped region 120. In some embodiments of the present invention, the second doped region 120 can include a plurality of doped stripes, and a plurality of contact plugs 122 can be disposed in each doped stripe as shown in FIG. 1. Please refer to FIGS. 3 and 4, which are schematic drawings illustrating a layout structure of an ESD protection semiconductor device provided by different modifications to the present invention. In some embodiments of the present invention, the ESD protection semiconductor device 100' and the layout structure of the ESD protection semiconductor device 100' include the second doped region 120, and the second doped region 120 includes a plurality of doped islands 120' arranged in the ring-shaped first doped region 110 as shown in FIG. 3. Also as shown in FIG. 3, a contact plug 122 is disposed in each doped island 120'. Furthermore, in other embodiments of the present invention, the ESD protection semiconductor device 100" and the layout structure of the ESD protection semiconductor device 100" include the second doped region 120, and the second doped region 120 includes a ring-shaped doped region 120" arranged in the ring-shaped first doped region 110 as shown in FIG. 4. Also as shown in FIG. 4, a plurality of contact plugs 122 are disposed in the ring-shaped doped region 120".

Please refer to FIGS. 1 and 2 again. A second well 108 is formed in the first well 106, and the second well 108 includes the second conductivity type. The ring-shaped first doped region 110 surrounds the second well 108 as shown in FIG. 1, and the first well 106 contacts sidewalls and a bottom of the second well 108 as shown in FIG. 2. Consequently, the second well 108 is spaced apart from the buried layer 104 by the first well 106. Furthermore, as shown in FIGS. 1 and 2, a ring-shaped isolation structure 150 is formed on a surface of the substrate 102, particularly at where the first well 106 contacts the second well 108. Consequently, the second well 108 is also spaced apart from the ring-shaped first doped region 110 and the second doped region 120 by the isolation structure 150. Another ring-shaped isolation structure 152 is formed in the second well 108. The isolation structures 150 and 152 can include field oxide (FOX) or shallow trench isolation (STI), but not limited to this.

Figure 5:
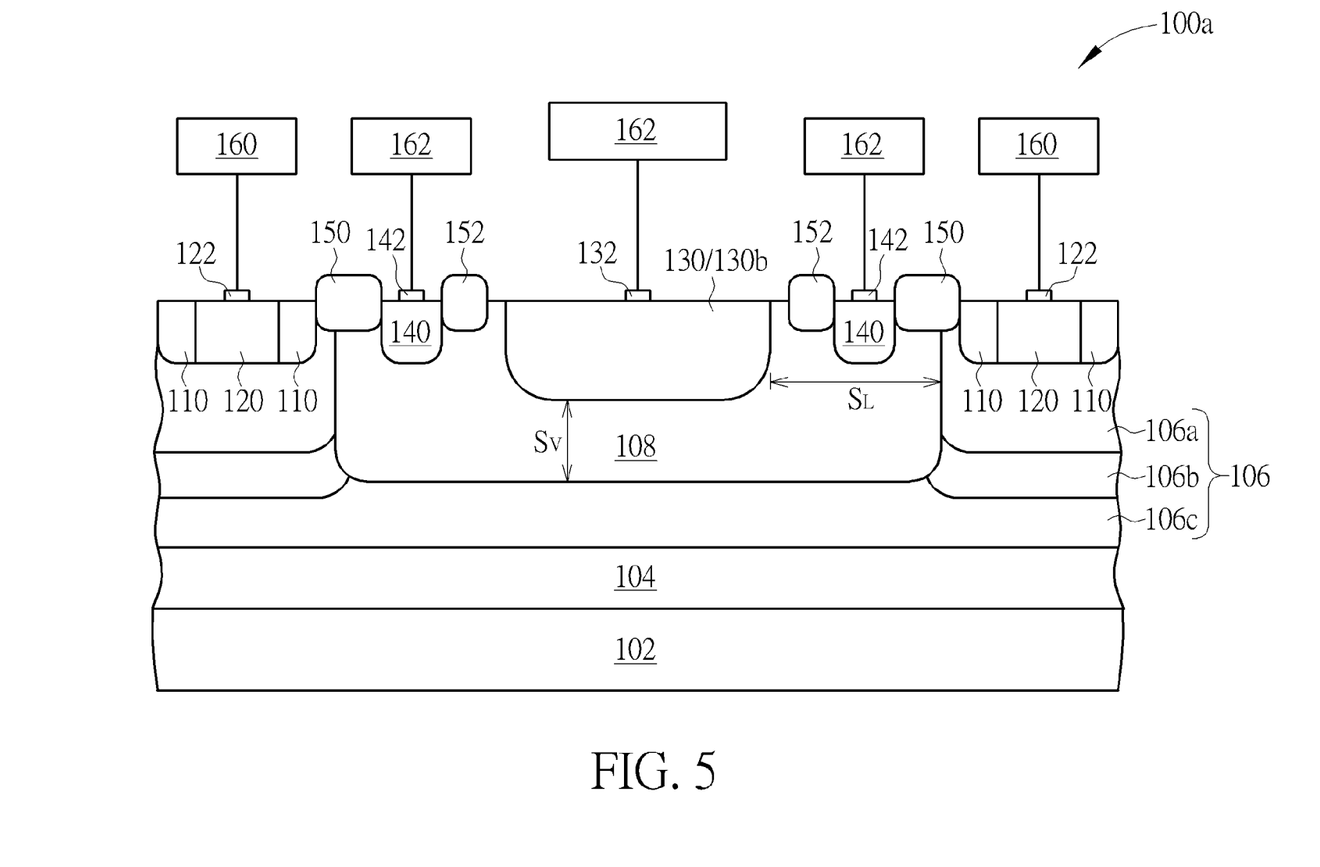
FIG. 5 is a schematic drawing illustrating an ESD protection semiconductor device provided by still another modification to the present invention.

A third doped region 130 is formed in the second well 108, and the third doped region 130 includes the first conductivity type. It is noteworthy that the third doped region 130 is formed in an internal side of the ring-shaped isolation structure 152. In some embodiments of the present invention, the third doped region 130 can further include a graded doped region 130a and a heavily doped region 130b, but not limited to this. Please refer to FIG. 5, which is a schematic drawing illustrating an ESD protection semiconductor device provided by a modification to the present invention. According to the ESD protection semiconductor device 100a provided by the modification, the third doped region 130 can merely include the heavily doped region 130b as shown in FIG. 5. Furthermore, a depth of the third doped region 130 is smaller than a depth of the second well 108 as shown in FIG. 2. Accordingly, the third doped region 130 is spaced apart from the first well 106 by the second well 108. Also as shown in FIG. 2, the third doped region 130 and the first well 106 include a lateral distance $S_L$ and a vertical distance $S_V$ defined therebetween, and the lateral distance $S_L$ is larger than the vertical distance $S_V$. Additionally, a plurality of contact plugs 132 are disposed on the third doped region 130.

Please still refer to FIGS. 1 and 2. A ring-shaped fourth doped region 140 is formed in the second well 108, and the fourth doped region 140 includes the second conductivity type. As shown in FIG. 1, the ring-shaped fourth doped region 140 surrounds the third doped region 130. It is noteworthy that since the fourth doped region 140 is disposed in between the isolation structure 150 and the isolation structure 152, and a depth of the fourth doped region 140 is smaller than a depth of the second well 108, the fourth doped region 140 is spaced apart from the third doped region 130 by the isolation structure 152 and the second well 108. Furthermore, the ring-shaped fourth doped region 140 is spaced apart from the first well 106 and the first doped region 110/the second doped region 120 by the isolation structure 150 and the second well 108. Additionally, a plurality of contact plugs 142 are disposed on the fourth doped region 140.

As shown in FIG. 2, the first doped region 110 physically contacts the second doped region 120. Furthermore, the first doped region 110 is electrically connected to the second doped region 120. Consequently, both of the first doped region 110 and the second doped region 120 are electrically connected to a first voltage line 160 by the contact plugs 122. The first voltage line 160 includes a first supply voltage. Therefore, the first doped region 110 and the second doped region 120 are electrically connected to the first supply voltage. In the preferred embodiment, the first supply voltage is a power voltage (Vdd). The third doped region 130 is electrically connected to a second voltage line 162 by the contact plugs 132, and the fourth doped region 140 is electrically connected to the second voltage line 162 by the contact plugs 142. The second voltage line 162 includes a second supply voltage. Therefore, the third doped region 130 and the fourth doped region 140 are electrically connected to the second supply voltage. In the preferred embodiment, the second supply voltage is a grounded voltage (Vss)

Figure 6:
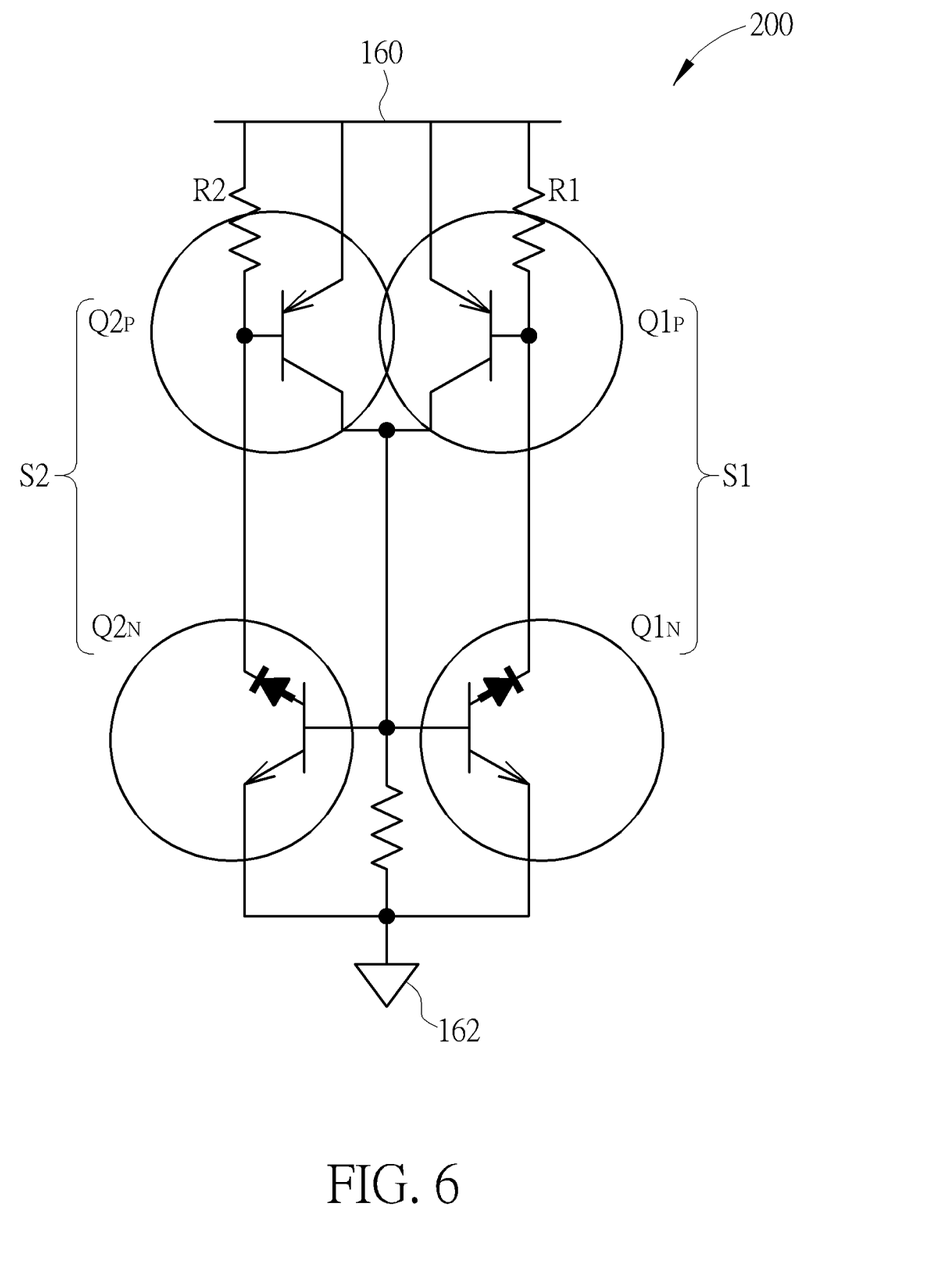
FIG. 6 is a circuit diagram of an ESD protection circuit provided by the present invention.

Please refer to FIGS. 2 and 6. According to the ESD protection semiconductor device 100 provided by the preferred embodiment, the second doped region 120, the first well 106 (including the n-well 106a, the high voltage well 106b and the deep well 106c)/the buried layer 104, and the second well 108 vertically construct a first pnp type bipolar junction transistor (hereinafter abbreviated as pnp-BJT) $Q1_P$, while the buried layer 104/the first well 106 (including the high voltage well 106b and the deep well 106c), the second well 108, and the third doped region 130 vertically construct a first npn type bipolar junction transistor (hereinafter abbreviated as npn-BJT) $Q1_N$. More important, the first pnp-BJT $Q1_P$ and the first npn-BJT $Q1_N$ construct a first SCR S1. Moreover, the second doped region 120, the first well 106 (including the n-well 106a), and the second well 108 laterally construct a second pnp-BJT $Q2_P$ while the first well 106 (including the n-well 106a), the second well 108, and the third doped region 130 laterally construct a second npn-BJT $Q2_N$. More important, the second pnp-BJT $Q2_P$ and the second npn-BJT $Q2_N$ construct a second SCR S2. Consequently, the ESD protection semiconductor device 100 provided by the present invention includes a dual SCR formed by the first SCR S1 and the second SCR S2.

Please refer to FIGS. 2 and 6 again. According to the preferred embodiment, an anode of the first SCR S1 is electrically connected to the first voltage line 160, and a cathode and a gate of the first SCR S1 are electrically connected to the second voltage line 162. In the same concept, an anode of the second SCR S2 is electrically connected to the first voltage line 160, and a cathode and a gate of the second SCR S2 are electrically connected to the second voltage line 162. As mentioned above, the first voltage line 160 includes the first supply voltage such as Vdd while the second voltage line 162 includes the second supply voltage such as Vss. Consequently, an ESD protection circuit 200 is obtained. It is noteworthy that because the concentration difference between the buried layer 104 and the second well 108 is larger than the concentration difference between the second well 108 and the first well 106, a trigger voltage of the first SCR S1 is smaller than a trigger voltage of the second SCR S2. In other words, when ESD event occurs, the vertical first SCR S1 is firstly turned on and followed by turning on the lateral second SCR S2. Furthermore, the first doped region 110 serves as a first resistor R1, and the first resistor R1 is connected between an emitter of the first pnp-BJT $Q1_P$ and a base of the first pnp-BJT $Q1_P$. As shown in FIGS. 2 and 6, the first resistor R1 (that is the first doped region 110) is electrically connected to the first voltage line 160. In the preferred embodiment, the first doped region 110 further serves as a second resistor R2 connected between an emitter of the second pnp-BJT $Q2_P$ and a base of the second pnp-BJT $Q2_P$. As shown in FIGS. 2 and 6, the second resistor R2 (that is the first doped region 110) is electrically connected to the first voltage line 160.

According to the ESD protection semiconductor device 100 and the layout structure of the ESD protection semiconductor device 100 provided by the present invention, the holding voltage can be adjusted by modifying a width of the fourth doped region 140. For example, when the width of the fourth doped region 140 is increased, the holding voltage is consequently raised. Usually, the raised holding voltage leads to an increase on the trigger voltage. However, since $R_{ON}$ of the ESD protection semiconductor device 100 provided by the present invention is lowered to even 96% by the introduction of the second doped region 120, the trigger voltage of the ESD protection semiconductor device 100 is reduced. Briefly speaking, the ESD protection semiconductor device 100 provided by the present invention is able to increase the holding voltage and simultaneously to reduce the trigger voltage. It is also noteworthy that because the second doped region 120 is disposed in the ring-shaped first doped region 110, the layout area is not increased. Additionally, it should be easily realized to those skilled in the art that though the layout structure provided by the preferred embodiment includes a rectangular shape, the layout structure can include a circular shape, but not limited to this: The shape of layout structure can be modified depending on different product requirements.

According to the ESD protection semiconductor device and the layout structure of the ESD protection semiconductor device provided by the present invention, the second doped region formed in the ring-shaped first doped region and complementary to the ring-shaped first doped region is provided. Thus a dual SCR is obtained by the second doped region and other well/doped region. The anodes of the dual SCR are all electrically connected to the Vdd line while the cathodes of the dual SCR are all electrically connected to the Vss line. Consequently, an ESD protection circuit is obtained. According to the ESD protection circuit, the ESD protection semiconductor device and the layout structure of the ESD protection semiconductor device provided by the present invention, lower $R_{ON}$, higher holding voltage, and superior robustness are all obtained without increasing layout area due to the introduction of the dual SCR.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electrostatic discharge (ESD) protection semiconductor device, comprising:
    a substrate;
    a buried layer buried in the substrate, the buried layer comprising a first conductivity type;
    a first well formed in the substrate, the first well comprising the first conductivity type;
    a first doped region formed in the first well, the first doped region comprising the first conductivity type;
    a second doped region formed in the first well and adjacent to the first doped region, the second doped region comprising a second conductivity type, and the first conductivity type and the second conductivity type being complementary to each other;
    a second well formed entirely within the first well, the second well comprising the second conductivity type and being spaced apart from the first doped region and the second doped region by the first well; and
    a third doped region formed in the second well, the third doped region comprising the first conductivity type.

2. The ESD protection semiconductor device according to claim 1, wherein the first well contacts sidewalls and a bottom of the second well.

3. The ESD protection semiconductor device according to claim 2, wherein the second well is spaced apart from the buried layer by the first well.

4. The ESD protection semiconductor device according to claim 2, wherein the third doped region and the first well comprise a lateral distance defined therebetween and a vertical distance defined therebetween, and the lateral distance is larger than the vertical distance.

5. The ESD protection semiconductor device according to claim 1, wherein the first doped region and the second doped region are electrically connected to a first supply voltage.

6. The ESD protection semiconductor device according to claim 1, further comprising a fourth doped region formed in the second well, and the fourth doped region being spaced apart from the first well and the second doped region by the second well.

7. The ESD protection semiconductor device according to claim 6, wherein the third doped region and the fourth doped region are electrically connected to a second supply voltage.

8. The ESD protection semiconductor device according to claim 1, wherein the third doped region comprises a graded doped region and a heavily doped region.

9. A layout structure of an electrostatic discharge (ESD) protection semiconductor device, comprising:
    a first well comprising a first conductivity type;
    a ring-shaped first doped region formed in the first well, the ring-shaped first doped region comprising the first conductivity type;
    at least a second doped region formed in the ring-shaped first doped region, the second doped region comprising a second conductivity type, and the first conductivity type and the second conductivity type being complementary to each other;
    a second well formed in the first well, the second well comprising the second conductivity type;
    a third doped region formed in the second well, the third doped region comprising the first conductivity type; and
    a ring-shaped fourth doped region formed in the second well and outside of the second doped region, the ring-shaped fourth doped region comprising the second conductivity type and surrounding the third doped region.

10. The layout structure of the ESD protection semiconductor device according to claim 9, wherein the ring-shaped first doped region is outside of the second well.

11. The layout structure of the ESD protection semiconductor device according to claim 9, further comprising a plurality of contact plugs electrically connected to the second doped region, the third doped region, and the ring-shaped fourth doped region.

12. The layout structure of the ESD protection semiconductor device according to claim 9, wherein the second doped region comprises a plurality of doped islands or a plurality of doped stripes.

13. The layout structure of the ESD protection semiconductor device according to claim 9, wherein the second doped region comprises a ring shape.

* * * * *